United States Patent [19]

Tanaka

[11] Patent Number: 5,140,138
[45] Date of Patent: Aug. 18, 1992

[54] BATTERY OPERATED PERSONAL TERMINAL APPARATUS

[75] Inventor: Yoshinori Tanaka, Yokohama, Japan

[73] Assignee: Kabushiki Kaisha Toshiba, Kawasaki, Japan

[21] Appl. No.: 523,431

[22] Filed: May 15, 1990

[30] Foreign Application Priority Data

May 16, 1989 [JP] Japan .................. 1-122259

[51] Int. Cl.⁵ .......................... G06F 1/00; H01M 2/10
[52] U.S. Cl. ...................................... 235/1 D; 429/97
[58] Field of Search .............. 361/334, 380, 391-395; 429/96-100; 235/1 D; 354/288 E

[56] References Cited

U.S. PATENT DOCUMENTS

| | | | |
|---|---|---|---|
| 3,742,832 | 7/1973 | Stoneham et al. | 354/288 E |
| 4,146,682 | 3/1979 | Nakao | 429/97 |
| 4,828,944 | 5/1989 | Yabe et al. | 429/97 |

OTHER PUBLICATIONS

Technical Drawings illustrating details of the Toshiba PT-2000 (English Translation is not available), May 31, 1988.

Toshiba Catalogue, PT-2000 (English Translation is not available) Mar. 1989.

Primary Examiner—L. T. Hix
Assistant Examiner—Eddie C. Lee
Attorney, Agent, or Firm—Cushman, Darby & Cushman

[57] ABSTRACT

A battery operated terminal apparatus having a battery a first notch cut in one side, and a housing. The battery is inserted through an insertion slot formed in the housing. A locking lever is arranged in the interior of the housing. The lock is rotatably supported and has a locking portion projecting into the notch cut out of battery. The battery inserted through the insertion slot is locked by the locking lever. A safety mechanism is disposed near the locking lever to fix the locking lever in a predetermined position when the battery is further into the receiving means, the safety mechanism released and the battery is discharged from the housing.

7 Claims, 6 Drawing Sheets

BATTERY OPERATED PERSONAL TERMINAL APPARATUS

BACKGROUND OF THE INVENTION

1. Field of the Invention

The present invention relates to a portable terminal apparatus, and more paticulaly, to a battery operated portable terminal apparatus.

2. Description of Related Art

Many types of portable terminal apparatus are known which may be used for a wide variety of financial, shopping, and other transactions. In addition, portable terminal apparatus may be used in a data collecting system for collecting quality data from a factory and sending the data to a host computer. These portable terminal apparatus have a central processing unit, a display device, a keyboard, a memory, and a battery for providing predetermined voltage to the display device, the keyboard, the central processing unit, and the memory.

The prior art portable terminal apparatus have a battery insertion slot for recieving the battery, and a storing portion for storing the battery. The battery has a notch cut in one end. The portable terminal apparatus also had a locking lever for projecting into the notch cut upon insertion of the battery. The lock lever locks the battery into a predetermined position. The lock lever releases from the notch when the other end of the lock lever is depressed. Accordingly, it is possible to lock and release the battery. However, if the insertion port is pointed downward when the lock lever is released, the battery falls away onto the floor or other area and often is damaged.

Accordingly, in the prior art device, the battery was often broken. Furthermore, the prior art device caused danger to the operator from the battery falling onto his foot.

SUMMARY OF THE INVENTION

Accordingly, it is an object of the present invention to provide a battery operated portable terminal apparatus with a safer battery release than that of prior art. Another object of the present invention to provide a battery operated portable terminal apparatus for more securely, receiving the battery than that of the prior art.

This object of the invention is achieved by providing an inproved battery, means for receiving the battery, means for holding the battery in a desired position when it is inserted into the receiving means, means for releasing the holding means to free the battery from the means for receiving, and means for enabling the releasing means to release the holding means when the battery is moved further into the receiving means.

DETAILED DESCRIPTION OF THE PREFERRED EMBODIMENT

Figure 1:
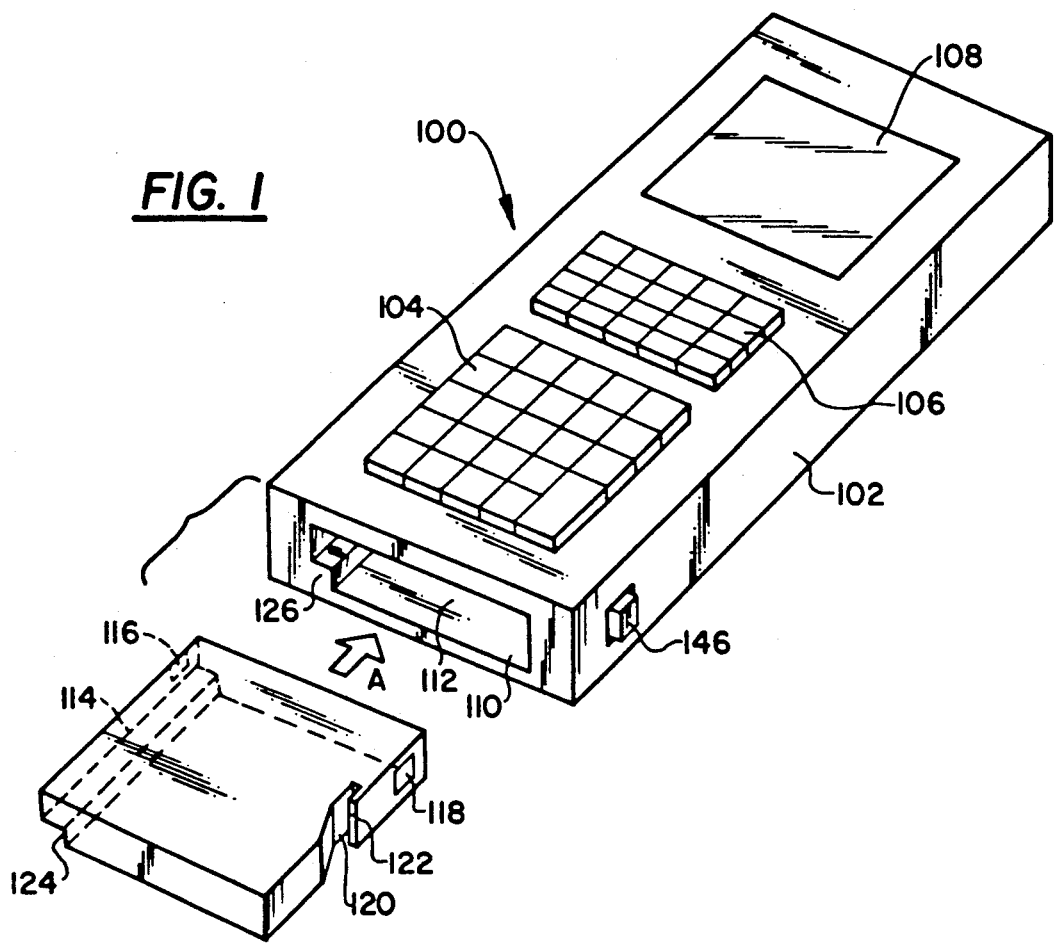
FIG. 1 is a schematic perspective view of a portable electronic apparatus according to the present invention.

FIG. 1 is a perspective view of a portable terminal apparatus 100 of the present invention. The portable terminal apparatus 100 has a housing 102, keyboards 104 and 106, and a display 108 such as a liquid crystal display. A battery inserting slot 110 is provided on a lower end portion of the housing 102. A battery storing portion 112 is provided inside of the battery inserting slot 110. Within the battery storing portion 112, a battery 114 is inserted.

Figure 2:
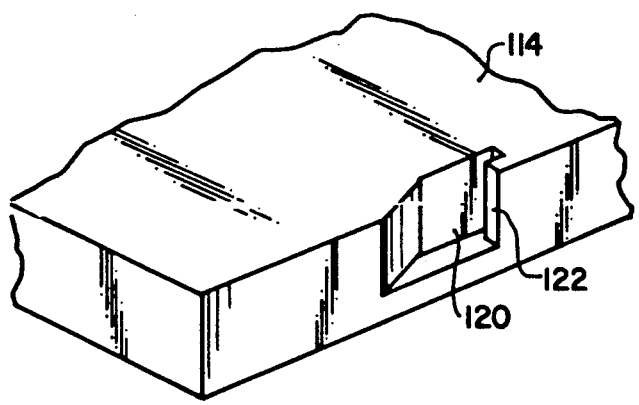
FIG. 2 is a sectional view showing a notch cut out of the battery.

A battery pack 114, including a nickel-cadmium battery, is formed in a rectangular shape. A pair of connecters 116 and 118 are arranged at both sides of the battery 114. A first notch 120 is formed on a side of the battery 114. As shown in FIG. 2, a pawl 122 is formed on one end of the first notch 120. A step 124 is formed on other side of the battery 114. A step 126 is formed on the interior of the housing 102.

Figure 3:
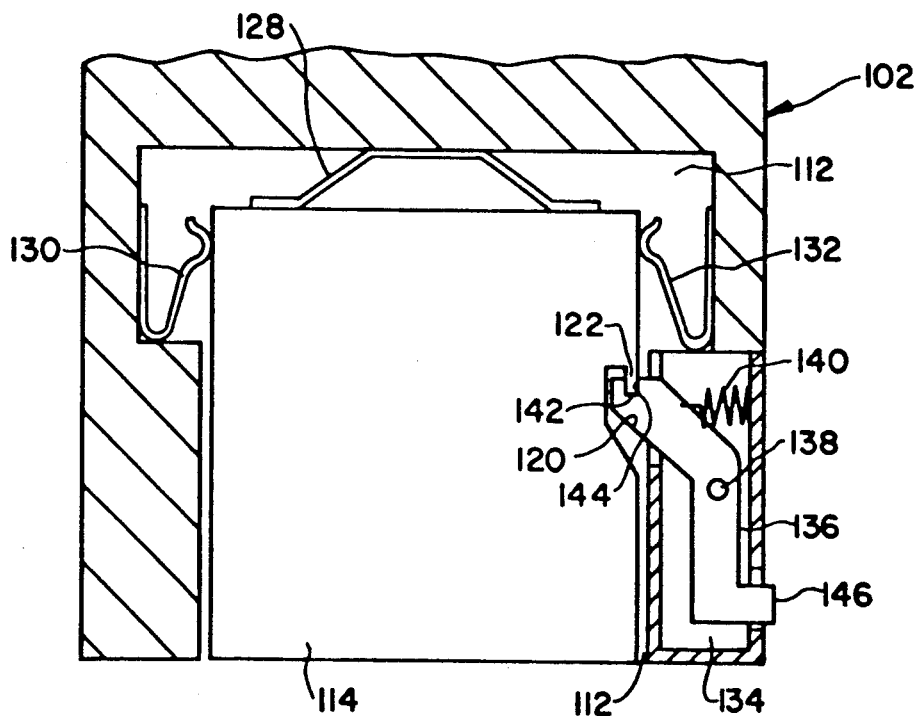
FIG. 3 is a schematic front view showing the interior a battery storing portion.

FIG. 3 schematically shows the interior of portable terminal apparatus 100. A spring 128 is arranged at an upperside of battery storing portion 112 for urging the battery away from the inserting direction (A). A pair of connecters 130 and 132 are arranged at both sides of battery storing portion 112 for recieving predetermined voltage from the battery 114.

A locking device 134 is arranged at a side of housing 102 against one side of inserted battery 114. The locking device 134 includes a lock lever 136 rotatably supported by shaft 138, and coil spring 140 for urging the lock lever 136 into a set position. An end portion 144 of the lock lever 136 is placed against the first notch cut 120. The end portion 144 is moveable for projecting into the first notch 120. A second notch cut 142 is formed on the end portion 144. Another end of lock lever 136 projects outside of the housing 102 and forms a release button 146.

The lock lever 136 is movable upon insertion of the battery 114. When the first notch 120 is placed against the one end portion 144 of the lock lever 128, the one end portion 144 projects into the first notch 120 due to the force of the coil spring 140. The spring 128 urges the battery 114 away from the inserting direction. Thus, the battery 114 moves downward so that the second notch 142 is intermeshed to the pawl 122 of the battery 114.

Figure 4A:
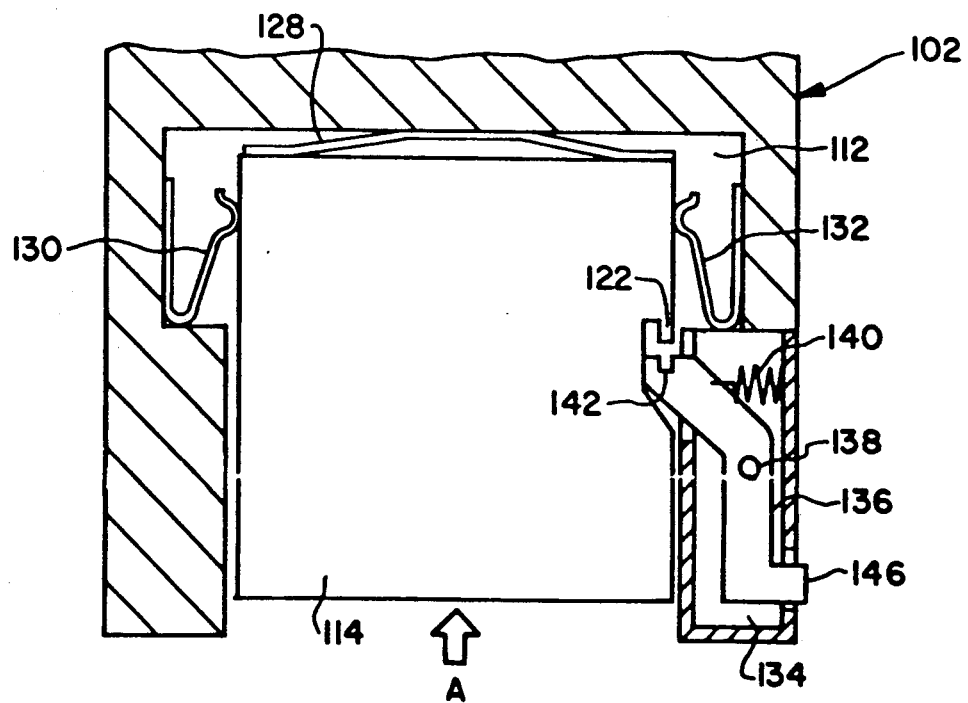
FIG. 4(a) to FIG. 4(c) are front views explaining the battery release operation.
Figure 4B:
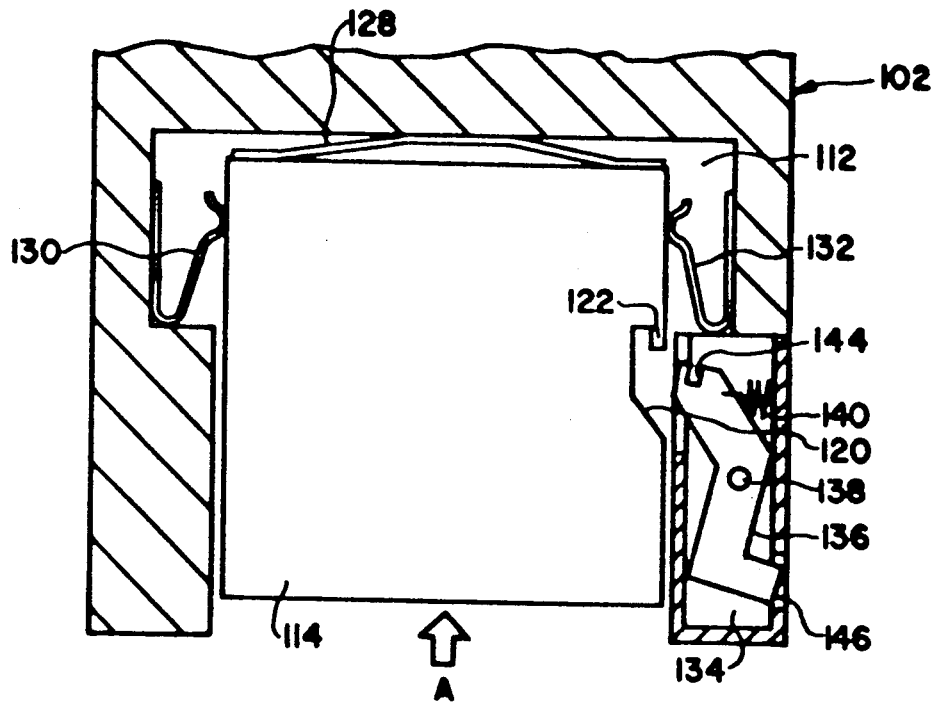
Figure 4C:
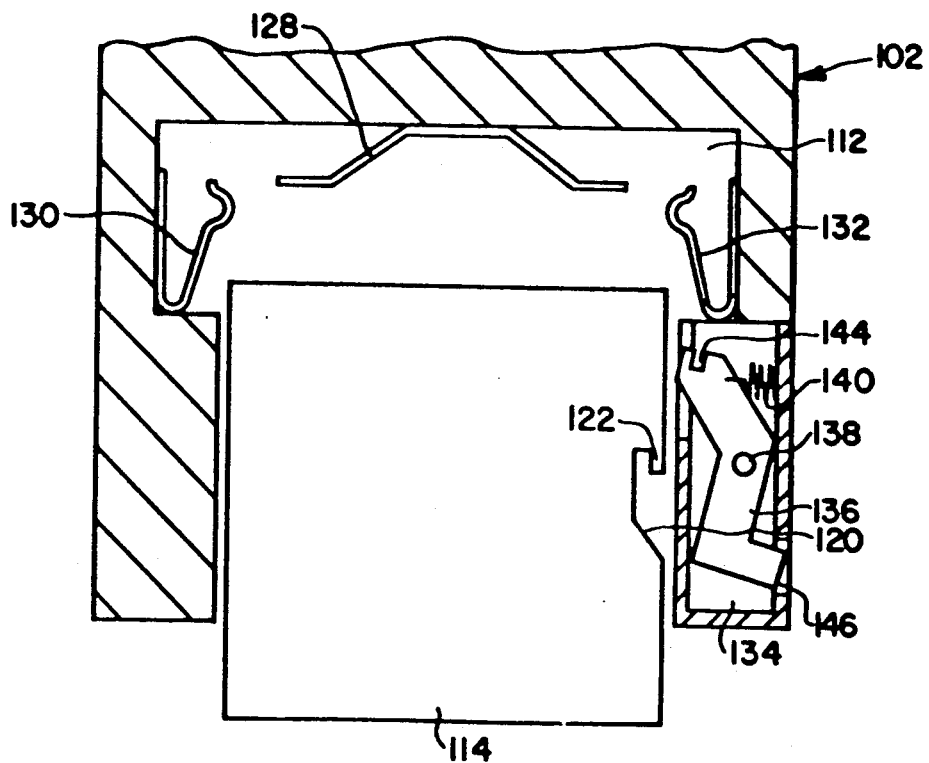

The process for releasing the battery 114 will be described with reference to FIG. 3 and FIG. 4(a) to FIG. 4(b). As shown in FIG. 3 the pawl 122 is normally intermeshed into the second notch 142 when a battery is inserted, so that the lock lever 136 can not move. When the battery 114 is moved in the insertion direction, the pawl 122 leaves the second notch 142 (as shown FIG. 4(a)). Thus, as shown FIG. 4(b), the operator may depress the release button 146 and the battery 114 can be release throught the battery inserting slot 110 (as shown FIG. 4(c)).

The battery 114 can not release only by depressing the release button. The battery 114 is released only if the battery 114 is moved in a predetermined direction and the release button 146 is depressed. Thus, when the battery 114 is released, the battery 114 is recieved by the operator of the portable terminal 100, so that the battery 114 will not fall and break and does not cause danger to the operator.

Other embodiments of the present invention will be described with reference FIG. 5 to FIG. 12.

Figure 5:
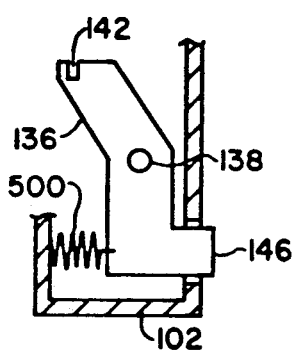
FIG. 5 to FIG. 10 are sectional views explaining other embodiments of the present invention.

FIG. 5 shows a second embodiment of the present invention. In this embodiment, coil spring 500 is arranged between housing 102 and another end of the lock lever 136.

Figure 6:
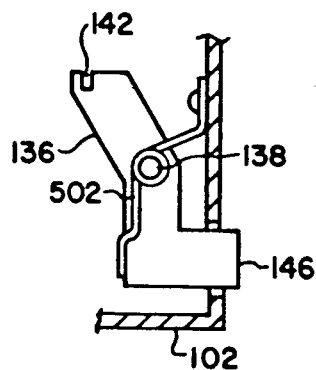

FIG. 6 shows a third embodiment of the present invention. In this embodiment, leaf spring 502 is arranged around the shaft 138. One end of the leaf spring 502 is fixed on the housing 102 and another end of the leaf spring 502 is fixed on the lock lever 136.

Figure 7:
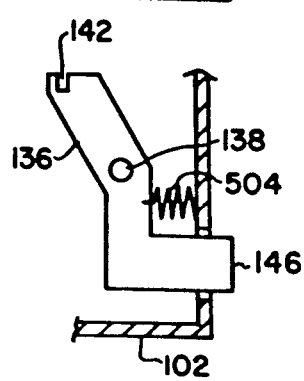

FIG. 7 shows a fourth embodiment of the present invention. In this embodiment, a coil spring 504 is arranged between housing 102 and a lower position of the lock lever 136.

Figure 8:
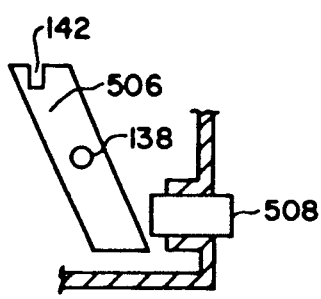

FIG. 8 shows a fifth embodiment of the present invention. In this embodiment, a lock lever 506 and a release button 508 are individually disposed in housing 102.

Figure 9:
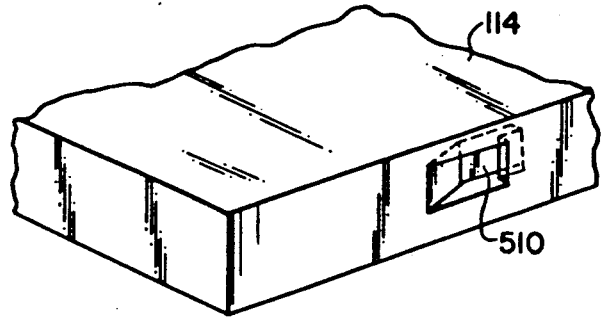

FIG. 9 shows a sixth embodiment of the present invention. In this embodiment, a notch 510 is formed in a partial area in the width direction of the battery 114.

Figure 10:
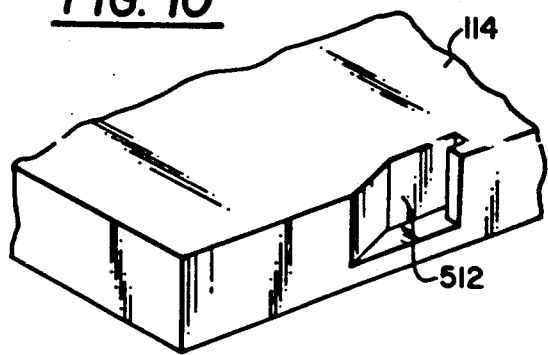

FIG. 10 shows a seventh embodiment of the present invention. In this embodiment, a notch 512 is formed on the battery 114, opening an upper surface of the battery.

Figure 11:
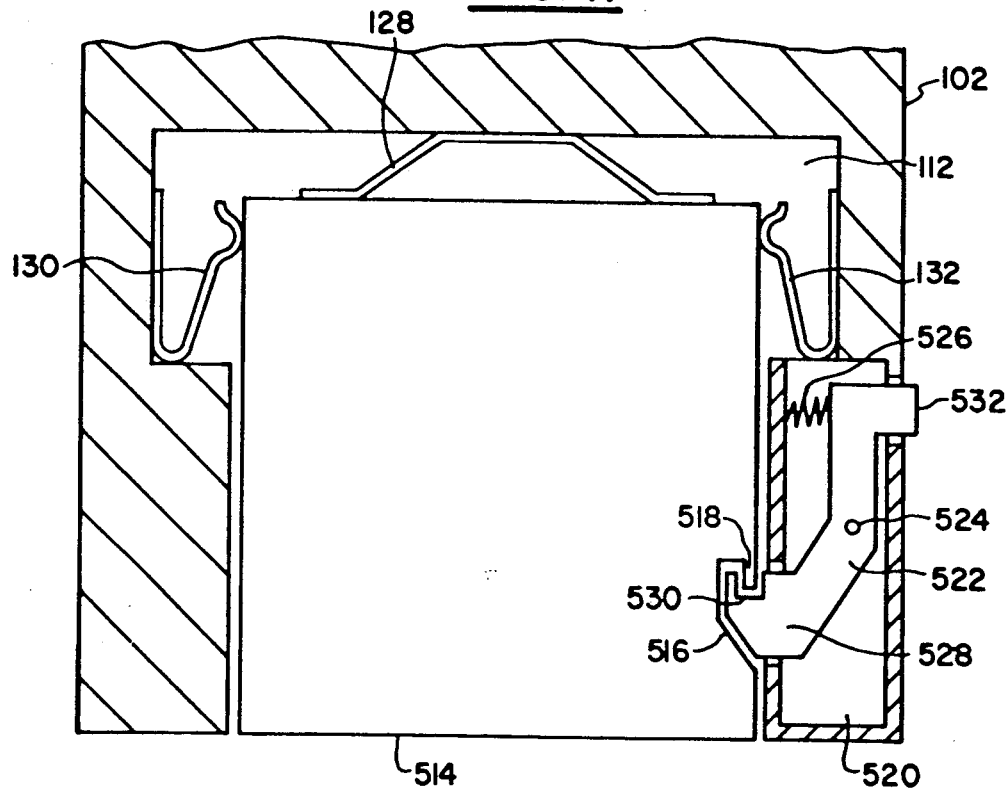
FIG. 11 and FIG. 12 are schematic front view explaining other embodiments of the present invention.

FIG. 11 shows a eight embodiment of the present invention. In this embodiment, a battery 514 has a notch 516 on a lower side. A pawl 518 is disposed at the upper side of the notch 516.

A locking device 520 is arranged at one side of hausing 102 placed against the one side of inserted battery 514. The locking device 520 includes a lock lever 522 rotatably supported by shaft 524, and coil spring 526 for urging the lock lever 522 into a locked position. The lower end portion 528 of the lock lever 522 is placed against the first notch 516. The lower end portion 528 is moveable for projecting into the first notch 516. A second notch 530 is formed on the lower end portion 528. Another end of lock lever 522 projects outside of housing 102 and forms the release button 532.

Figure 12:
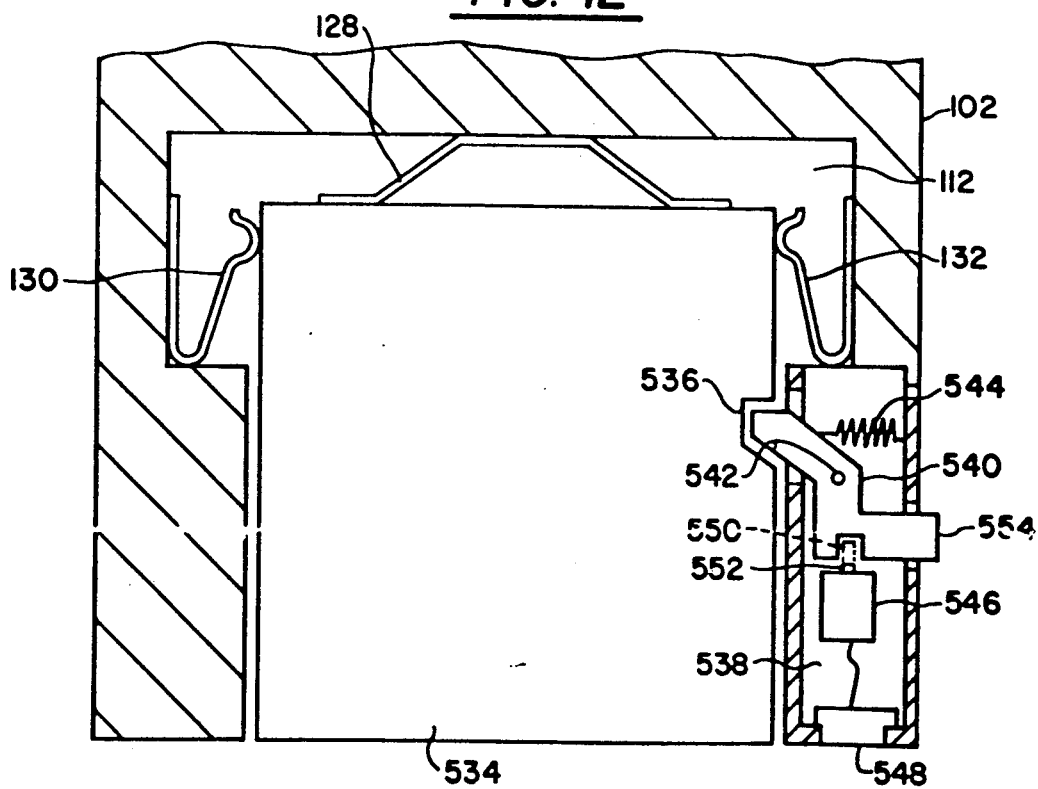

FIG. 12 showing a ninth embodiment of the present invention. In this embodiment, a battery 534 has a notch 536 on a side.

A locking device 538 is arranged at a side of housing 102, and placed against one side of inserted battery 534. The locking device 536 includes a lock lever 540 rotatably supported by shaft 542, a coil spring 544 for urging the lock lever 540 into a lock position, a solenoid 546 and a detector 548. The lock lever 540 includes a second noch 550 and the solenoid 546 includes a pawl 552. Detector 548 detects whether an external object is located against the lower surface of the battery. The solenoid 546 receives a detected signal from detector 548 and drives the pawl 552 according to the detected signal into the second notch 550 when an object is present, thus locking the lock lever. When an external object is near the battery, the solenoid drives the pawl 552 to release the battery. In this condition, the battery 114 can be released when release button 554 is depressed.

Figure 13:
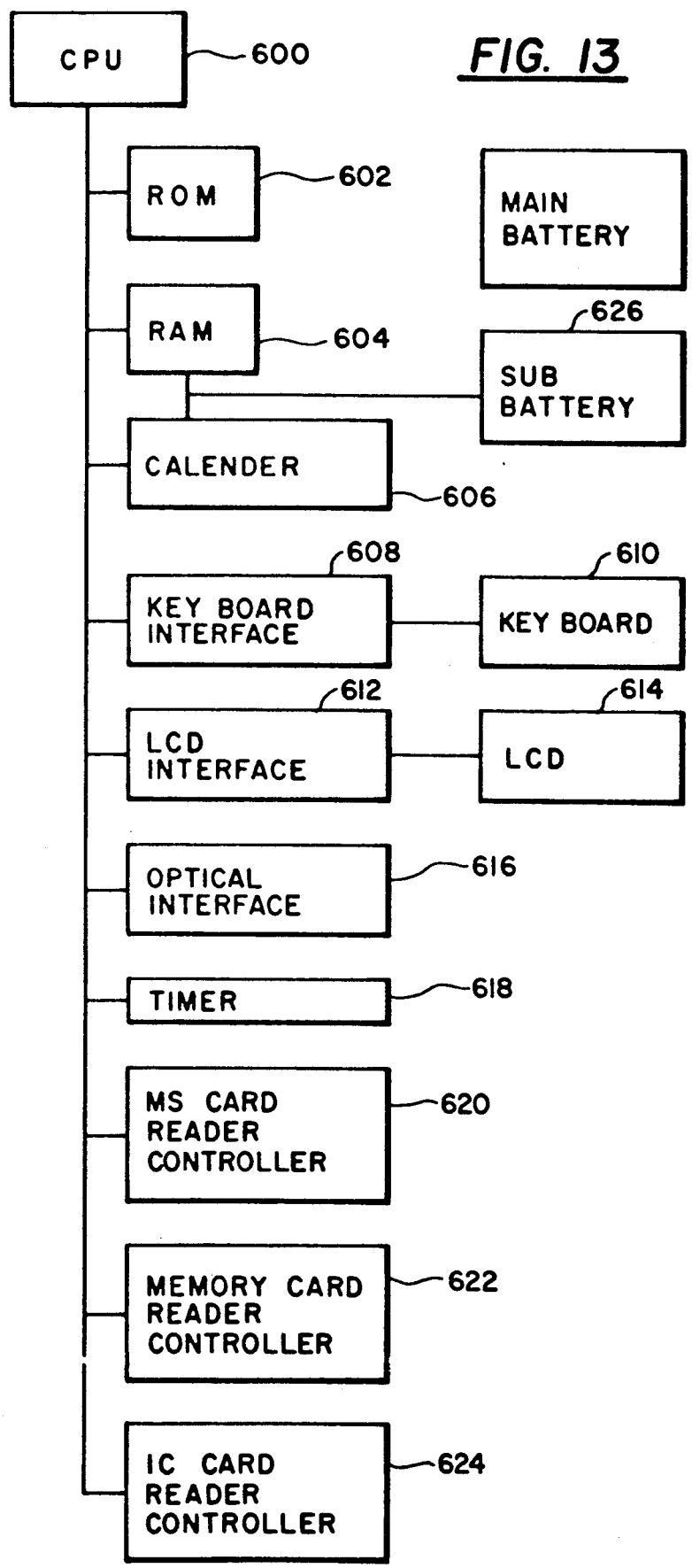
FIG. 13 is a block diagram of a portable electronic apparatus according to the present invention.

A block diagram of a portable electronic apparatus according to the present invention is arranged as shown in FIG. 13.

A circuit of the portable electronic apparatus comprises a central processing unit (CPU)600, a read only memory(rom)602, randam acces memory(RAM)604, calender unit 606, key bord interface 608, key bord 610, liquid crystal display(LCD) interface 612, liquid crystal display(LCD) 614, optical interface 616, timer unit 618, magnett stripe(MS) card reader controller 620, memory card reader controller 622, IC card reader controller 624, sub battery 626, main battery 628. The main battery 628 provides predetermined voltage to the each of unit when a power on switch (not shown) is depressed. The sub battery 626 any time provides predetermined voltage to the RAM 604 and calender unit 606.

What is claimed is:

1. A battery operated portable terminal apparatus comprising:
   a battery pack; and
   housing means for receiving the battery pack, the housing means comprising:
     insertion slot means for enabling the battery pack to be inserted into the housing;
     means for storing the battery pack in the housing;
     means for locking the battery pack at a first predetermined position in the storing means, the locking means permitting the battery pack to be moved further into the storing means to a second predetermined position in a direction away from the insertion slot means, the locking means preventing the battery pack from being removed from the housing means when the battery pack is in the first predetermined position;
   manually actuated operating means for unlocking the battery pack only when the battery pack is in the second predetermined position in the storing means, the manually actuated operating means enabling the battery pack to be removed from the housing means through the insertion slot means;
   means for preventing the manually actuated operating means from unlocking the battery pack when the battery pack is at the first predetermined position; and
   means for discharging the battery pack from the housing in a direction towards the insertion slot means when the manually actuated operating means enables the battery pack to be removed from the housing.

2. A battery operated portable terminal apparatus according to claim 1 wherein said battery pack has a notch cut in one side of a surface.

3. A battery operated portable terminal apparatus according to claim 2 wherein said locking means includes
   a lever for projecting into the notch cut in the battery pack; and
   support means for rotatably supporting the lever.

4. A battery operated portable terminal apparatus comprising:
   a battery pack having a first notch cut in a surface of the battery pack and a pawl formed in one side of the first notch;
   an insertion slot for receiving the battery pack;
   a locking lever, rotatably supported, said locking lever comprising: a first end portion having a second notch for intermeshing with the pawl of the first notch thereby locking the battery pack into the insertion slot, and a second end portion for being depressed to unlock the battery pack only when the battery pack is moved farther into the insertion slot, the intermeshing between the second notch and the pawl of the first notch locking the locking lever into a position where the battery pack is locked into the insertion slot, the pawl releasing the second notch to permit the second end portion to be depressed to release the battery pack only when the battery pack is moved farther into the insertion slot; and means for urging the first end portion of the locking lever into the first notch of the battery pack to lock the battery pack into the insertion slot.

5. A battery operated portable terminal apparatus as in claim 4, further comprising loop spring means located in the insertion slot for urging the battery pack out of the insertion slot.

6. A battery operated portable terminal apparatus comprising:

a battery pack;

means for receiving the battery pack;

means for holding the battery pack in a desired position when said battery pack is inserted into the receiving means;

means for releasing the holding means to free the battery pack from the means for receiving;

sensor means for sensing when an external object is near the means for receiving, said sensor means generating a signal indicative thereof; and means, responsive to the signal provided by the sensor means, for enabling the means for releasing to operate.

7. A battery operated portable terminal apparatus comprising:

a battery pack having a first notch cut in a surface of the battery pack and a pawl formed on one side of the first notch; and housing means for receiving the battery pack, the housing means comprising:

insertion slot means for enabling the battery pack to be inserted into the housing means;

means for storing the battery pack in the housing means;

locking lever means for locking the battery pack at a predetermined position in the storing means, the locking lever means enabling the battery pack to move further into the housing means in a direction away from the insertion slot means, the locking lever means preventing the battery pack from being removed from the housing means, the locking lever means comprising:

a first end for projecting into the first notch of the battery pack thereby locking the battery pack at the predetermined position, the first end having a second notch for cooperating with the pawl of the first notch to prevent the first end from being removed from the first notch when the battery pack is at the predetermined position; and a second end for being pressed when the battery pack is moved further into the housing means thereby enabling the battery pack to be removed from the housing means through the insertion slot means while the second end is pressed;

first means for urging the first end of the locking lever means into the first notch of the battery pack; and second means for urging the battery pack in a direction towards the insertion slot means, the second urging means urging the battery pack out of the housing means through the insertion slot means when the second end of the locking lever means is pressed.

* * * * *